(12) United States Patent
Zhang

(10) Patent No.: US 11,114,037 B1
(45) Date of Patent: Sep. 7, 2021

(54) GATE DRIVER ON ARRAY (GOA) CIRCUIT AND DISPLAY APPARATUS

(71) Applicant: SHENZHEN CHINA STAR OPTOELECTRONICS SEMICONDUCTOR DISPLAY TECHNOLOGY CO., LTD., Shenzhen (CN)

(72) Inventor: Liuqi Zhang, Shenzhen (CN)

( * ) Notice: Subject to any disclaimer, the term of this patent is extended or adjusted under 35 U.S.C. 154(b) by 234 days.

(21) Appl. No.: 16/496,438

(22) PCT Filed: Apr. 25, 2019

(86) PCT No.: PCT/CN2019/084304
§ 371 (c)(1),
(2) Date: Sep. 22, 2019

(87) PCT Pub. No.: WO2020/199284
PCT Pub. Date: Oct. 8, 2020

(30) Foreign Application Priority Data

Apr. 4, 2019 (CN) .......................... 201910271154.7

(51) Int. Cl.
*G09G 3/3266* (2016.01)
*G09G 3/3225* (2016.01)

(52) U.S. Cl.
CPC ......... *G09G 3/3266* (2013.01); *G09G 3/3225* (2013.01); *G09G 2300/0823* (2013.01); *G09G 2310/08* (2013.01)

(58) Field of Classification Search
CPC .. G09G 3/3225; G09G 3/3266; G09G 3/3674; G09G 3/3677; G09G 3/3688; G09G 2300/0408; G09G 2300/23; G09G 2300/0823; G09G 2310/0264; G09G 2310/0267; G09G 2310/0286; G09G 2310/06; G09G 2310/08
See application file for complete search history.

(56) References Cited

U.S. PATENT DOCUMENTS

| | | | | |
|---|---|---|---|---|
| 2002/0167026 A1* | 11/2002 | Azami | ................... | G02F 1/1333 257/200 |
| 2003/0128180 A1* | 7/2003 | Kim | ....................... | G11C 19/00 345/100 |
| 2003/0189542 A1* | 10/2003 | Lee | ....................... | G09G 3/3677 345/93 |
| 2003/0227433 A1* | 12/2003 | Moon | ................... | G09G 3/3677 345/100 |
| 2003/0231735 A1* | 12/2003 | Moon | ..................... | G11C 19/28 377/64 |

(Continued)

FOREIGN PATENT DOCUMENTS

| CN | 1885378 A | 12/2006 |
|---|---|---|
| CN | 101206318 A | 6/2008 |

(Continued)

*Primary Examiner* — Michael J Eurice

(57) ABSTRACT

Embodiments of the application provide a gate driver on array (GOA) circuit and a display apparatus, which is capable of outputting signals of negative pulse waveforms using a simplified circuit design and improving output capability of the GOA circuit by changing a high voltage level of a clock signal to a voltage level of a first high level signal. Thus, the GOA circuit is improved by the first capacitor and the second capacitor, which make the GOA circuit more stable.

20 Claims, 8 Drawing Sheets

(56) References Cited

U.S. PATENT DOCUMENTS

| | | | | |
|---|---|---|---|---|
| 2004/0150610 A1* | 8/2004 | Zebedee | G11C 19/28 | 345/100 |
| 2004/0189584 A1* | 9/2004 | Moon | G09G 3/3677 | 345/100 |
| 2006/0210012 A1* | 9/2006 | Yamaguchi | G11C 19/00 | 377/64 |
| 2006/0290390 A1* | 12/2006 | Jang | G11C 19/28 | 327/112 |
| 2007/0038909 A1* | 2/2007 | Kim | G09G 3/3677 | 714/726 |
| 2007/0070021 A1* | 3/2007 | Ahin | H03K 5/15093 | 345/100 |
| 2008/0150875 A1* | 6/2008 | Ieong | G11C 19/28 | 345/100 |
| 2008/0174589 A1* | 7/2008 | Nagao | H03K 19/01735 | 345/211 |
| 2008/0218650 A1 | 9/2008 | Koshihara et al. | | |
| 2008/0219401 A1* | 9/2008 | Tobita | G11C 19/28 | 377/79 |
| 2009/0189677 A1* | 7/2009 | Lee | G09G 3/3677 | 327/427 |
| 2010/0141641 A1* | 6/2010 | Furuta | G11C 19/184 | 345/213 |
| 2011/0273421 A1 | 11/2011 | Chung | | |
| 2011/0279420 A1* | 11/2011 | Sung | G09G 3/20 | 345/204 |
| 2012/0087459 A1* | 4/2012 | Nakamizo | G11C 19/184 | 377/64 |
| 2012/0140052 A1* | 6/2012 | Baek | H04N 13/398 | 348/58 |
| 2015/0028933 A1* | 1/2015 | Chen | H03K 17/162 | 327/382 |
| 2015/0185520 A1* | 7/2015 | Xu | G02F 1/133514 | 349/38 |
| 2016/0351160 A1* | 12/2016 | In | G09G 3/3225 | |
| 2018/0053482 A1* | 2/2018 | Xiao | G09G 3/3677 | |
| 2018/0068630 A1 | 3/2018 | Xiao et al. | | |
| 2019/0019471 A1 | 1/2019 | Zeng | | |
| 2020/0035137 A1 | 1/2020 | Chen | | |
| 2020/0035179 A1 | 1/2020 | Chen | | |
| 2020/0258464 A1* | 8/2020 | Wang | H04M 1/0266 | |
| 2021/0183312 A1* | 6/2021 | Kim | G09G 3/3258 | |

FOREIGN PATENT DOCUMENTS

| | | |
|---|---|---|
| CN | 101261378 A | 9/2008 |
| CN | 102034423 A | 4/2011 |
| CN | 103744206 A | 4/2014 |
| CN | 104332126 A | 2/2015 |
| CN | 104599629 A | 5/2015 |
| CN | 107221299 A | 9/2017 |
| CN | 107358931 A | 11/2017 |
| CN | 107993627 A | 5/2018 |
| CN | 108831400 A | 11/2018 |
| CN | 109119011 A | 1/2019 |

\* cited by examiner

GATE DRIVER ON ARRAY (GOA) CIRCUIT AND DISPLAY APPARATUS

BACKGROUND OF INVENTION

Field of Invention

The present invention relates to a technical field of display technologies, and more particularly, to a gate driver on array (GOA) circuit and display apparatus.

Description of Prior Art

Gate driver on array (GOA) is a technique that integrates a gate driving circuit unto an array substrate of a display panel, to substitute for a gate driving integrated circuit (IC), so as to reduce the cost from material and production process aspects.

In an organic light-emitting diode (OLED) display panel, a GOA circuit requires two signal output pulse waveforms: one is positive pulse waveforms, which can be generated from a conventional GOA circuit, and the other is negative pulse waveforms. However, design complexity hikes with increasing function demands of generating the negative pulse waveforms for existing GOA circuits.

SUMMARY OF THE INVENTION

Technical problems: An objective of the invention is to provide a gate driver on array (GOA) circuit and display apparatus to ameliorate the problem of design complexity for providing negative pulse waveform generation capability to GOA circuit.

Technical Solutions

An embodiment of the application provides a GOA circuit comprising: a multi-stage cascade of GOA units, each of which includes: an input module, an inversion module, a clamping module, a first output module, a second output module, and an output control module.

The input module is connected to a current stage clock signal and an prior stage transmitted signal, and electrically connected to a first node, and is configured to output the prior stage transmitted signal to the first node under control of the current stage clock signal.

The inversion module is electrically connected to a second node and the first node, and is configured to control a voltage level of the second node under control of a voltage level of the first node.

The clamping module is connected to a low level signal and electrically connected to the second node and the first node, and is configured to maintain the voltage level of the first node at a voltage level of the low level signal under control of the voltage level of the second node.

The first output module is connected to the current stage clock signal and electrically to the second node, and is configured to output a current stage transmitted signal under control of the voltage level of the second node.

The second output module is connected to the current stage clock signal and electrically connected to the second node, and is configured to output a current stage scanning signal under control of the voltage level of the second node.

The output control module is connected to a first high level signal and a second high level signal, and electrically to the first node, the current stage scanning signal, and the current stage transmitted signal, and is configured to pull the current stage transmitted signal up to a voltage level of the first high level signal, and the current stage scanning signal up to a voltage level of the second high level signal under control of the voltage level of the first node.

The voltage level of the first high level signal is greater than the voltage level of the second high level signal, and a high voltage level of the current stage clock signal is equal to the voltage level of the first high level signal.

The GOA circuit further comprises an eleventh transistor, a gate terminal and a source terminal of the eleventh transistor are connected to a reset signal, and a drain terminal of the eleventh transistor is connected to the first node.

The GOA circuit further comprises a first capacitor and a second capacitor.

A first terminal of the first capacitor is electrically connected to the first node, and a second terminal of the first capacitor is electrically connected to a next stage transmitted signal.

A first terminal of the second capacitor is electrically connected to the current stage clock signal, and a second terminal of the second capacitor is electrically connected to the current stage transmitted signal.

In the GOA circuit of the application, the input module comprises a first transistor, a gate terminal of the first transistor is connected to the current stage clock signal, and a source terminal of the first transistor is connected to the prior stage transmitted signal, and a drain terminal of the first transistor is connected to the first node.

In the GOA circuit of the application, the inversion module comprises a second transistor, a third transistor, a fourth transistor, and a fifth transistor. A gate terminal of the second transistor and a gate terminal of the third transistor are electrically connected to the first node, and a source terminal of the second transistor and a source terminal of the third transistor are connected to the low level signal, a drain terminal of the second transistor, a drain terminal of the fourth transistor, and a gate terminal of the fifth transistor are electrically connected, a gate terminal of the fourth transistor, a source terminal of the fourth transistor and a source terminal of the fifth transistor are electrically connected with a high level signal, a drain terminal of the third transistor and a drain terminal of the fifth transistor are electrically connected with the second node.

In the GOA circuit of the application, the clamping module comprises a sixth transistor. A gate terminal of the sixth transistor is connected to the second node, and a source terminal of the sixth transistor is electrically connected to the low level signal, and a drain terminal of the sixth transistor is connected to the first node.

In the GOA circuit of the application, the first output module comprises a seventh transistor. A gate terminal of the seventh transistor is connected to the second node, and a source terminal of the seventh transistor is connected to the current stage clock signal, and a drain terminal of the seventh transistor is connected to the current stage transmitted signal.

In the GOA circuit of the application, the second output module comprises an eighth transistor. A gate terminal of the eighth transistor is connected to the second node, and a source terminal of the eighth transistor is connected to the current stage clock signal, and a drain terminal of the eighth transistor is connected to the current stage scanning signal.

In the GOA circuit of the application, the output control module comprises a ninth transistor and a tenth transistor, a gate terminal of the ninth transistor and a gate terminal of the tenth transistor are electrically connected to the first node, and a source terminal of the ninth transistor is connected to the first high level signal, and a source terminal of the tenth transistor is connected to the second high level signal, a drain terminal of the ninth transistor is connected to the current stage transmitted signal, and a drain terminal of the tenth transistor is connected to the current stage scanning signal.

A GOA circuit comprising: a multi-stage cascade of GOA units, each of which includes: an input module, an inversion module, a clamping module, a first output module, a second output module, and an output control module;

The input module is connected to a current stage clock signal and an prior stage transmitted signal, and electrically connected to a first node, and is configured to output the prior stage transmitted signal to the first node under control of the current stage clock signal.

The inversion module is electrically connected to a second node and the first node, and is configured to control a voltage level of the second node under control of a voltage level of the first node.

The clamping module is connected to a low level signal and electrically connected to the second node and the first node, and is configured to maintain the voltage level of the first node at a voltage level of the low level signal under control of the voltage level of the second node.

The first output module is connected to the current stage clock signal and electrically to the second node, and is configured to output a current stage transmitted signal under control of the voltage level of the second node.

The second output module is connected to the current stage clock signal and electrically connected to the second node, and is configured to output a current stage scanning signal under control of the voltage level of the second node.

The output control module is connected to a first high level signal and a second high level signal, and electrically to the first node, the current stage scanning signal, and the current stage transmitted signal, and is configured to pull the current stage transmitted signal up to a voltage level of the first high level signal, and the current stage scanning signal up to a voltage level of the second high level signal under control of the voltage level of the first node.

The voltage level of the first high level signal is greater than the voltage level of the second high level signal, and a high voltage level of the current stage clock signal is equal to the voltage level of the first high level signal.

In the GOA circuit of the application, the input module comprises a first transistor, a gate terminal of the first transistor is connected to the current stage clock signal, and a source terminal of the first transistor is connected to the prior stage transmitted signal, and a drain terminal of the first transistor is connected to the first node.

In the GOA circuit of the application, the inversion module comprises a second transistor, a third transistor, a fourth transistor, and a fifth transistor, a gate terminal of the second transistor and a gate terminal of the third transistor are electrically connected to the first node, and a source terminal of the second transistor and a source terminal of the third transistor are connected to the low level signal, a drain terminal of the second transistor, a drain terminal of the fourth transistor, and a gate terminal of the fifth transistor are electrically connected, a gate terminal of the fourth transistor, a source terminal of the fourth transistor and a source terminal of the fifth transistor are electrically connected with a high level signal, a drain terminal of the third transistor and a drain terminal of the fifth transistor are electrically connected with the second node.

In the GOA circuit of the application, the clamping module comprises a sixth transistor, a gate terminal of the sixth transistor is connected to the second node, and a source terminal of the sixth transistor is electrically connected to the low level signal, and a drain terminal of the sixth transistor is connected to the first node.

In the GOA circuit of the application, the first output module comprises a seventh transistor. A gate terminal of the seventh transistor is connected to the second node, and a source terminal of the seventh transistor is connected to the current stage clock signal, and a drain terminal of the seventh transistor is connected to the current stage transmitted signal.

In the GOA circuit of the application, the second output module comprises an eighth transistor. A gate terminal of the eighth transistor is connected to the second node, and a source terminal of the eighth transistor is connected to the current stage clock signal, and a drain terminal of the eighth transistor is connected to the current stage scanning signal.

In the GOA circuit of the application, the output control module comprises a ninth transistor and a tenth transistor, a gate terminal of the ninth transistor and a gate terminal of the tenth transistor are electrically connected to the first node, and a source terminal of the ninth transistor is connected to the first high level signal, and a source terminal of the tenth transistor is connected to the second high level signal, a drain terminal of the ninth transistor is connected to the current stage transmitted signal, and a drain terminal of the tenth transistor is connected to the current stage scanning signal.

In the GOA circuit of the application, the GOA circuit further comprises an eleventh transistor, a gate terminal and a source terminal of the eleventh transistor are connected to a reset signal, and a drain terminal of the eleventh transistor is connected to the first node.

In the GOA circuit of the application, the GOA circuit further comprises a first capacitor and a second capacitor.

A first terminal of the first capacitor is electrically connected to the first node, and a second terminal of the first capacitor is electrically connected to a next stage transmitted signal.

A first terminal of the second capacitor is electrically connected to the current stage clock signal, and a second terminal of the second capacitor is electrically connected to the current stage transmitted signal.

An embodiment of the application provides a display apparatus comprising: a GOA circuit comprising a multi-stage cascade of GOA units, each of which includes: an input module, an inversion module, a clamping module, a first output module, a second output module, and an output control module.

The input module is connected to a current stage clock signal and an prior stage transmitted signal, and electrically connected to a first node, and is configured to output the prior stage transmitted signal to the first node under control of the current stage clock signal.

The inversion module is electrically connected to a second node and the first node, and is configured to control a voltage level of the second node under control of a voltage level of the first node.

The clamping module is connected to a low level signal and electrically connected to the second node and the first node, and is configured to maintain the voltage level of the first node at a voltage level of the low level signal under control of the voltage level of the second node.

The first output module is connected to the current stage clock signal and electrically to the second node, and is configured to output a current stage transmitted signal under control of the voltage level of the second node.

The second output module is connected to the current stage clock signal and electrically connected to the second node, and is configured to output a current stage scanning signal under control of the voltage level of the second node.

The output control module is connected to a first high level signal and a second high level signal, and electrically to the first node, the current stage scanning signal, and the current stage transmitted signal, and is configured to pull the current stage transmitted signal up to a voltage level of the first high level signal, and the current stage scanning signal up to a voltage level of the second high level signal under control of the voltage level of the first node.

The voltage level of the first high level signal is greater than the voltage level of the second high level signal, and a high voltage level of the current stage clock signal is equal to the voltage level of the first high level signal.

In the display apparatus of the application, the input module comprises a first transistor, a gate terminal of the first transistor is connected to the current stage clock signal, and a source terminal of the first transistor is connected to the prior stage transmitted signal, and a drain terminal of the first transistor is connected to the first node.

In the display apparatus of the application, the inversion module comprises a second transistor, a third transistor, a fourth transistor, and a fifth transistor, a gate terminal of the second transistor and a gate terminal of the third transistor are electrically connected to the first node, and a source terminal of the second transistor and a source terminal of the third transistor are connected to the low level signal, a drain terminal of the second transistor, a drain terminal of the fourth transistor, and a gate terminal of the fifth transistor are electrically connected, a gate terminal of the fourth transistor, a source terminal of the fourth transistor and a source terminal of the fifth transistor are electrically connected with a high level signal, a drain terminal of the third transistor and a drain terminal of the fifth transistor are electrically connected with the second node.

In the display apparatus of the application, the clamping module comprises a sixth transistor, a gate terminal of the sixth transistor is connected to the second node, and a source terminal of the sixth transistor is electrically connected to the low level signal, and a drain terminal of the sixth transistor is connected to the first node.

Useful Effects

Embodiments of the application provide a GOA circuit and a display apparatus, which is capable of outputting signals of negative pulse waveforms using simplified circuit design and improving output capability of the GOA circuit by changing a high voltage level of a clock signal to the voltage level of the first high level signal. Thus, the GOA circuit is improved by the first capacitor and the second capacitor, which makes the GOA circuit more stable.

BRIEF DESCRIPTION OF DRAWINGS

To clear disclose the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

Figure 1:
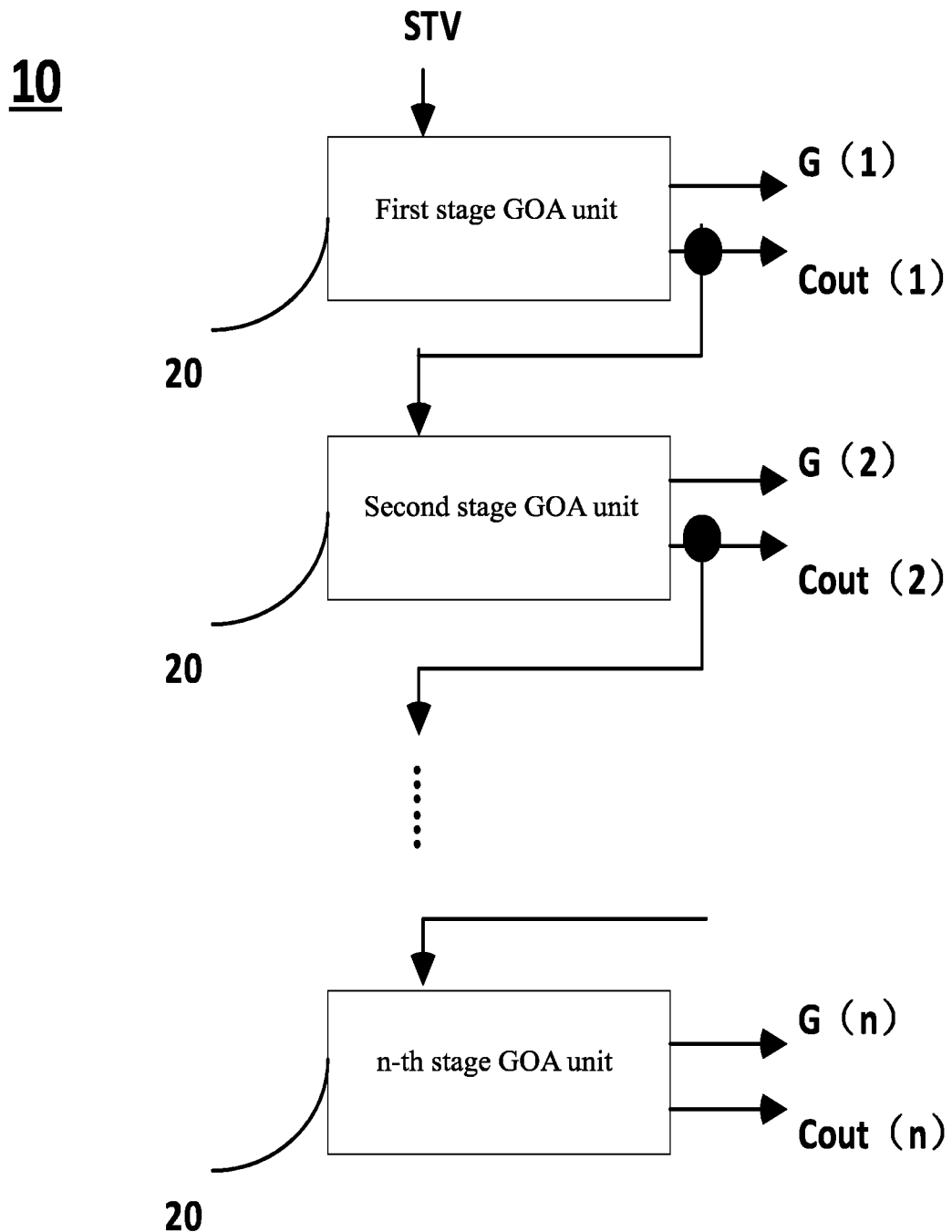
FIG. 1 is a schematic view showing a gate on array (GOA) circuit of an embodiment of the invention.

The following is a clear and comprehensive description of the technical solutions in the embodiments of this application with reference to the drawings in the embodiments of the application. Obviously, the embodiments described are only part of this application, not for exhaustive illustration. Based on the embodiments of the application, other embodiments which may be easily obtained by those having ordinary skills in the art without paying additional creative effort fall within the scope of the application for protection.

A transistor used in embodiments of the application may be a thin film transistor, a field effect transistor (FET) or a device with similar characteristics. A source and a drain terminal of a transistor are symmetrical, and thus interchangeable. In the embodiments of the application, to distinguish the other two terminals of a transistor besides gate terminal, one is referred to as a source terminal, and the other is referred to as a drain terminal. According to the shape convention in the drawings, a middle end of a transistor is a gate terminal, an end for signal input is a source terminal, and an end for signal output is a drain terminal. In addition, transistors used in the embodiment of the application are n-type transistors, which is turned on when the gate terminal is in a high level and turned off when the gate terminal is in a low level.

Please refer to FIG. 1, where FIG. 1 is a schematic diagram of a gate on array (GOA) circuit provided in an embodiment of the application. As shown in FIG. 1, the GOA circuit 10 provided in the embodiment of the application includes a multi-stage cascade of GOA units 20. Each level of GOA units 20 is used to output a negative pulse waveform scanning signal and a negative pulse waveform stage transmitted signal. When the GOA circuit 10 is in operation, a first stage GOA unit 20 is connected to a starting signal STV, and, in response, the first stage GOA unit 20, a second level GOA unit 20, a third level GOA unit 20, . . . the last level GOA unit 20 starts in turn.

For example, an (n−1)th stage GOA unit, an n-th stage GOA unit and an (n+1)th stage GOA unit in the cascade of the GOA units 20 are described as examples. When the (n−1)th stage GOA unit is in operation, the (n−1)th stage GOA unit outputs a scanning signal of negative pulse waveforms and a level transmitted signal of negative pulse waveforms, which is used to control the luminescence of light-emitting diodes in a light-emitting diode (OLED) display panel. Subsequently, a level transmitted signal of the (n−1)th stage GOA unit starts the n-th stage GOA unit, and the n-th stage GOA unit outputs a scanning signal of negative pulse waveforms and a stage transmitted signal of negative pulse waveforms. Finally, the stage transmitted signal of the n-th stage GOA unit starts the (n+1)th stage GOA unit, and the (n+1)th stage GOA unit outputs a scanning signal of negative pulse waveforms and a stage transmitted signal of negative pulse waveforms.

Figure 2:
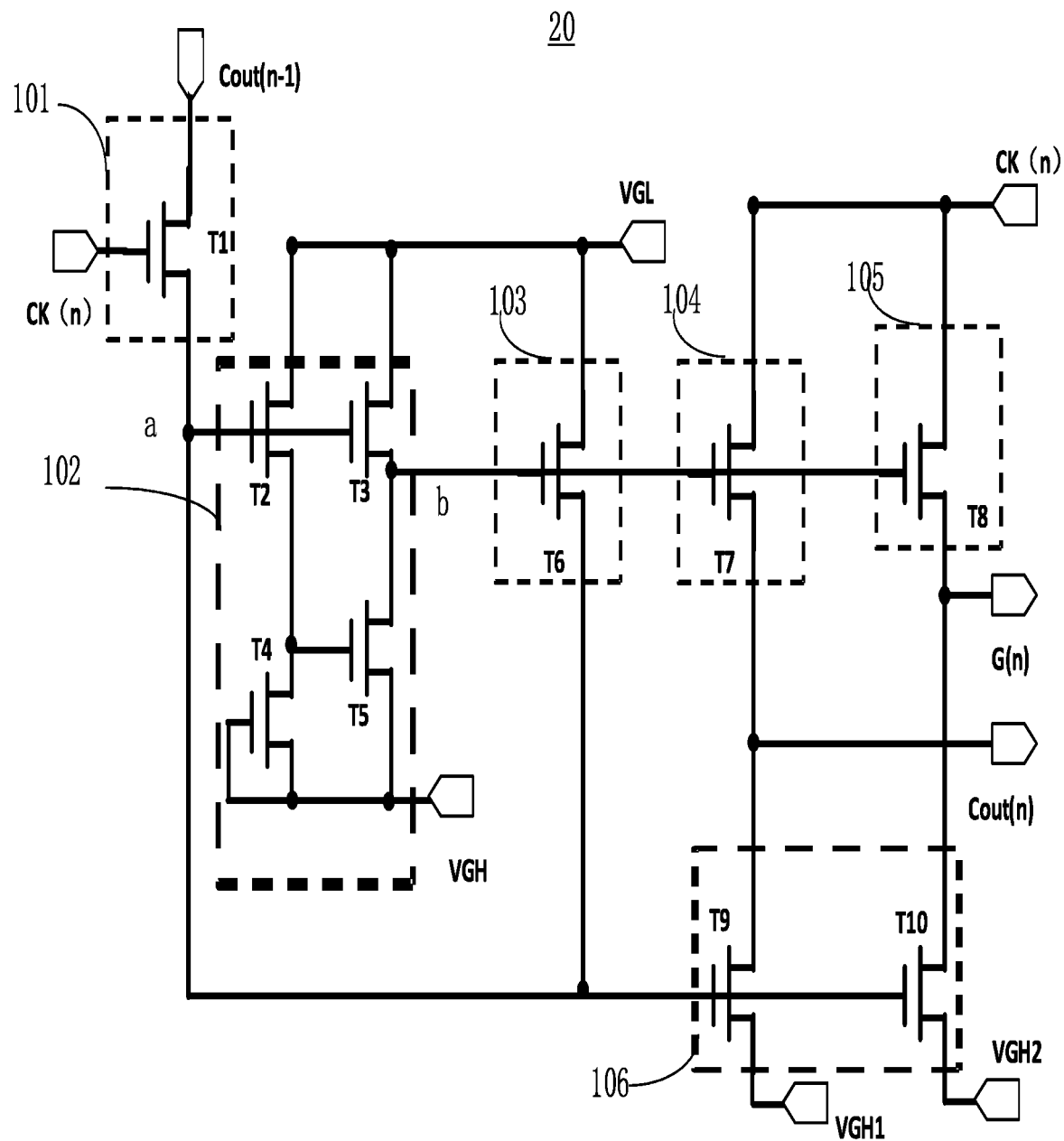
FIG. 2 is a schematic view showing a first circuit of a GOA unit in a GOA circuit of an embodiment of the invention.

Further, please refer to FIG. 2, which is a schematic view showing a first circuit of a GOA unit in a GOA circuit of an embodiment of the invention. As shown in FIG. 2, the GOA circuit includes an input module 101, an inversion module 102, a clamping module 103, a first output module 104, a second output module 105, and an output control module 106.

The input module 101 is connected to a current stage clock signal CK(n) and an prior stage transmitted signal Cout(n−1), and electrically connected to a first node a, and is configured to output the prior stage transmitted signal Cout(n−1) to the first node a under control of the current stage clock signal CK(n).

The inversion module 102 is electrically connected to a second node b and the first node a, and is configured to control a voltage level of the second node b under control of a voltage level of the first node a.

The clamping module 103 is connected to a low level signal VGL and electrically connected to the second node b and the first node a, and is configured to maintain the voltage level of the first node a at a voltage level of the low level signal VGL under control of the voltage level of the second node b;

The first output module 104 is connected to the current stage clock signal CK(n) and electrically to the second node b, and is configured to output the current stage transmitted signal Cout(n) under control of the voltage level of the second node b.

The second output module 105 is connected to the current stage clock signal CK(n) and electrically connected to the second node b, and is configured to output the current stage scanning signal G(n) under control of the voltage level of the second node b.

The output control module 106 is connected to a first high level signal VGH1 and a second high level signal VGH2, and electrically to the first node a, the current stage scanning signal G(n), and the current stage transmitted signal Cout(n), and is configured to pull the current stage transmitted signal Cout(n) up to a voltage level of the first high level signal VGH1, and the current stage scanning signal G(n) up to a voltage level of the second high level signal VGH2 under control of the voltage level of the first node a.

The voltage level of the first high level signal VGH1 is greater than the voltage level of the second high level signal VGH2, and a high voltage level of the current stage clock signal CK(n) is equal to the voltage level of the first high level signal VGH1.

In some embodiments, the input module 101 comprises a first transistor T1, a gate terminal of the first transistor T1 is connected to the current stage clock signal CK(n), and a source terminal of the first transistor T1 is connected to the prior stage transmitted signal Cout(n−1), and a drain terminal of the first transistor T1 is connected to the first node a.

In some embodiments, the inversion module 102 comprises a second transistor T2, a third transistor T3, a fourth transistor T4, and a fifth transistor T5. A gate terminal of the second transistor T2 and a gate terminal of the third transistor T3 are electrically connected to the first node a. A source terminal of the second transistor T2 and a source terminal of the third transistor T3 are connected to the low level signal VGL. A drain terminal of the second transistor T2, a drain terminal of the fourth transistor T4, and a gate terminal of the fifth transistor T5 are electrically connected, a gate terminal of the fourth transistor T4, a source terminal of the fourth transistor T4 and a source terminal of the fifth transistor T5 are electrically connected with a high level signal VGH. A drain terminal of the third transistor T3 and a drain terminal of the fifth transistor T5 are electrically connected with the second node b.

In some embodiments, the clamping module 103 comprises a sixth transistor T6. A gate terminal of the sixth transistor T6 is connected to the second node b. A source terminal of the sixth transistor T6 is electrically connected to the low level signal VGL. A drain terminal of the sixth transistor T6 is connected to the first node a.

In some embodiments, the first output module 104 comprises a seventh transistor T7. A gate terminal of the seventh transistor T7 is connected to the second node b. A source terminal of the seventh transistor T7 is connected to the current stage clock signal CK(n). A drain terminal of the seventh transistor T7 is connected to the current stage transmitted signal Cout(n).

In some embodiments, the second output module 105 comprises an eighth transistor T8. A gate terminal of the eighth transistor T8 is connected to the second node b. A source terminal of the eighth transistor T8 is connected to the current stage clock signal CK(n). A drain terminal of the eighth transistor T8 is connected to the current stage scanning signal G(n).

In some embodiments, the output control module 106 comprises a ninth transistor T9 and a tenth transistor T10. A gate terminal of the ninth transistor T9 and a gate terminal of the tenth transistor T10 are electrically connected to the first node a. A source terminal of the ninth transistor T9 is connected to the first high level signal VGH1. A source terminal of the tenth transistor T10 is connected to the second high level signal VGH2. A drain terminal of the ninth transistor T9 is connected to the current stage transmitted signal Cout(n). A drain terminal of the tenth transistor T10 is connected to the current stage scanning signal G(n).

Note that existing GOA circuit typically uses N-type transistors to generate a positive pulse waveform signal, and uses P-type transistors to generate negative pulse waveform signal. A P-type transistor is ON when a gate terminal of the transistor is low, and is OFF when the gate terminal is high. That is, an existing light-emitting diode display panel requires two types of transistors for simultaneous generating positive and negative pulse waveform signals.

The difference between the GOA circuit 10 provided in the embodiment of the application and an existing GOA circuit is that: the GOA circuit 10 generates negative pulse waveform signals using N-type transistors, so that the same type of transistors can be used in light-emitting diodes to simplify the engineering process and circuit design.

Figure 3:
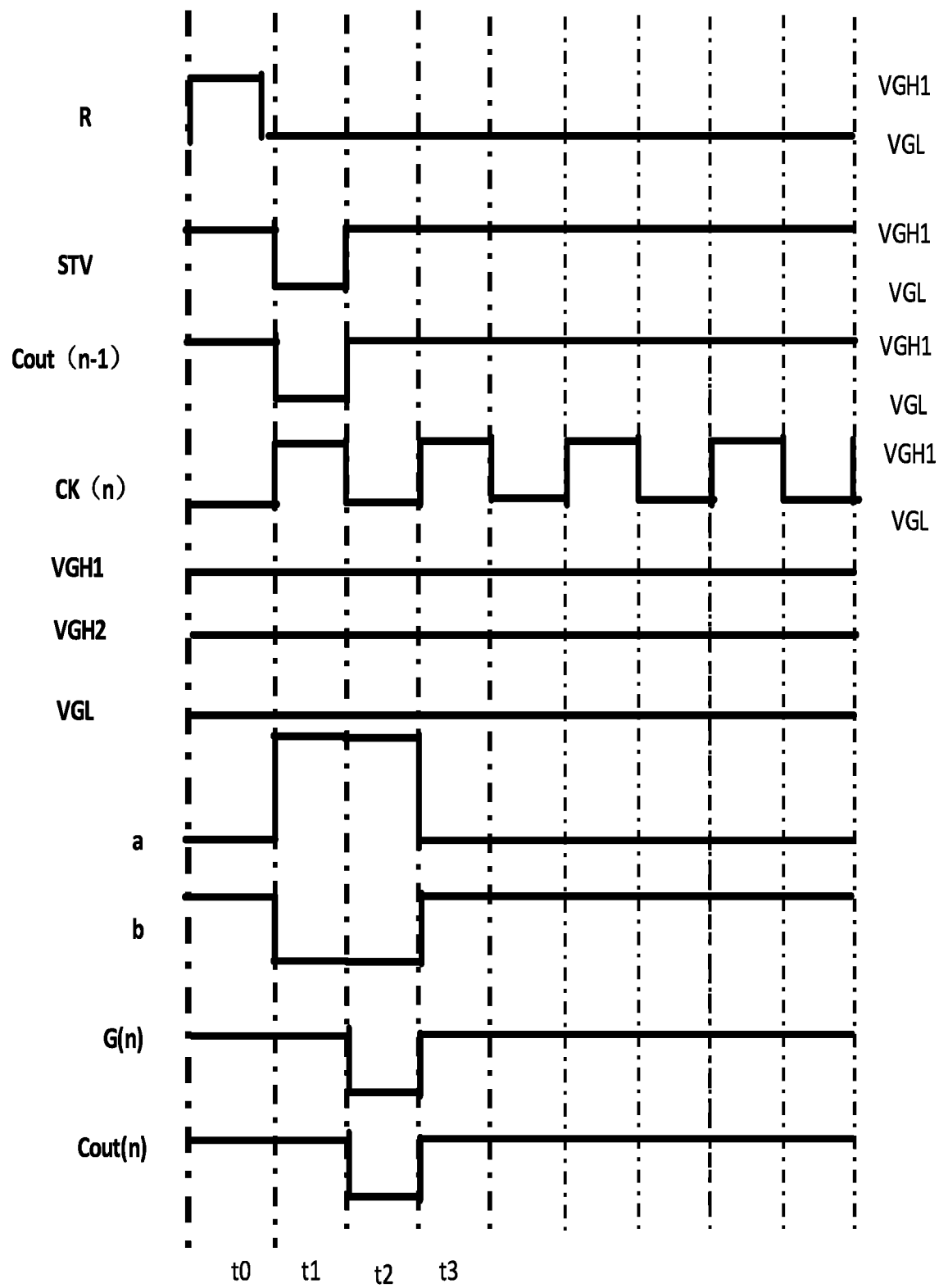
FIG. 3 is a signal timing sequence diagram of a GOA unit in a GOA circuit of an embodiment of the invention.

Specifically, please refer to FIGS. 2 and 3, where FIG. 3 is a s signal timing sequence diagram of a GOA unit in a GOA circuit of an embodiment of the invention. Operation timing sequences of the GOA units 20 includes: a first time period t1, a second time period t2, and a third time period t3.

Specifically, in the first time period t1, the current clock signal CK(n) is high, so that the first transistor T1 is ON. The prior stage transmitted signal Cout (n−1) is output to the first node a, so that the voltage level of the first node A is low. Because the voltage level of the first node a is high, the second transistor T2 and the third transistor T3 are OFF, which makes the voltage level of the second Node b high. Because the voltage level of the second Node B is high, so that the sixth transistor T6, the seventh transistor T7, and the eighth transistor T8 are ON, the voltage level of the current stage transmitted signal Cout(n) is high, the voltage level of the current scanning signal G(n) is high, the low level signal VGL is output to the first node a through the sixth transistor T6 to maintain the voltage level of the first node a at the voltage level of the low level signal VGL. Because the voltage level of the first node a is low, the ninth transistor T9 and the tenth transistor T10 are OFF.

In the second time period t2, the current clock signal CK(n) is low, so that the first transistor T1 is off, the voltage level of the first node A is low. Because the voltage level of the first node A is low, the second transistor T2 and the third transistor T3 are OFF, which makes the voltage level of the second node b high. Because the voltage level of the second Node B is high, so that the sixth transistor T6, the seventh transistor T7, and the eighth transistor T8 is ON, the voltage level of the current stage transmitted signal Cout(n) is low, the voltage level of the current scanning signal G(n) is low, the low level signal VGL is output to the first node a through the sixth transistor T6, to maintain the voltage level of the first node a at the voltage level of the low level signal VGL. Because the voltage level of the first node a is low, the ninth transistor T9 and the tenth transistor T10 are OFF.

In the third time period t3, the current stage clock signal CK(n) is a high, so that the first transistor T1 is ON, the prior stage transmitted signal Cout (n−1) is output to the first node a to make the voltage level of the first node a high. Because the voltage level of the first node a is high, the second transistor T2 and the third transistor T3 are ON, so that the voltage level of the second node b is low. Because the voltage level of the second node b is low, the sixth transistor T6, the seventh transistor T7, and the eighth transistor T8 are OFF. Because the voltage level of the first node a is high, so that the ninth transistor T9 and the tenth transistor T10 are ON, the voltage level of the current stage transmitted signal Cout(n) is the voltage level of the first high level signal VGH1, and the voltage level of the this stage scanning signal G(n) is the voltage level of the second high level signal VGH2.

After that, the first transistor T1 is repeatedly turned ON by the current level clock signal CK(n), and the prior stage transmitted signal Cout (n−1) continues to be output to the first node a to maintain the voltage level of the first node a at high, thus ensuring that the current stage transmitted signal Cout(n) outputs the voltage level of the first high level signal VGH1 for a long time, and the current scan signal G(n) outputs the second high level signal VGH2 for a long time.

Figure 4:
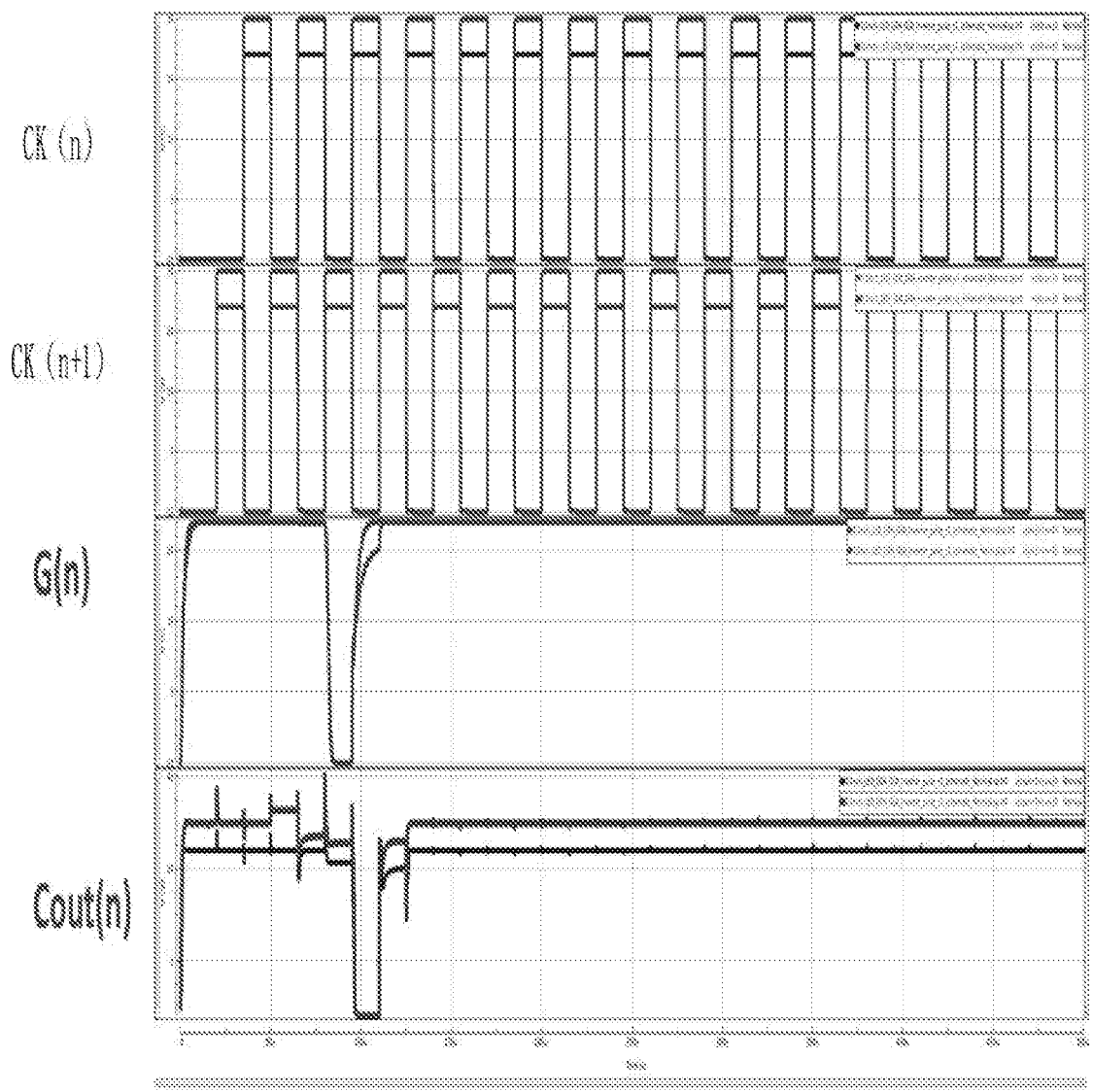
FIG. 4 is a signal timing sequence diagram showing principles for enhancing output capabilities of a GOA unit in a GOA circuit of an embodiment of the invention.

Further, please refer to FIG. 4, where FIG. 4 is a signal timing sequence diagram showing principles of enhancing output capabilities of a first circuit of a GOA unit in a GOA circuit of an embodiment of the invention. With reference to FIGS. 2 and 4, a time period of the rising current stage scanning signal G(n) is reduced from 15.15 us to 5.53 us, which is improved by about three times. The main cause is that the voltage level of the current stage transmitted signal Cout(n) increases with pulling up of a high voltage level and a stage transmitted maintaining voltage level of the current level clock signal CK(n), thus improving ON state conductivity of the ninth transistor T9 and the tenth transistor T10 and enhancing output capability.

Figure 5:
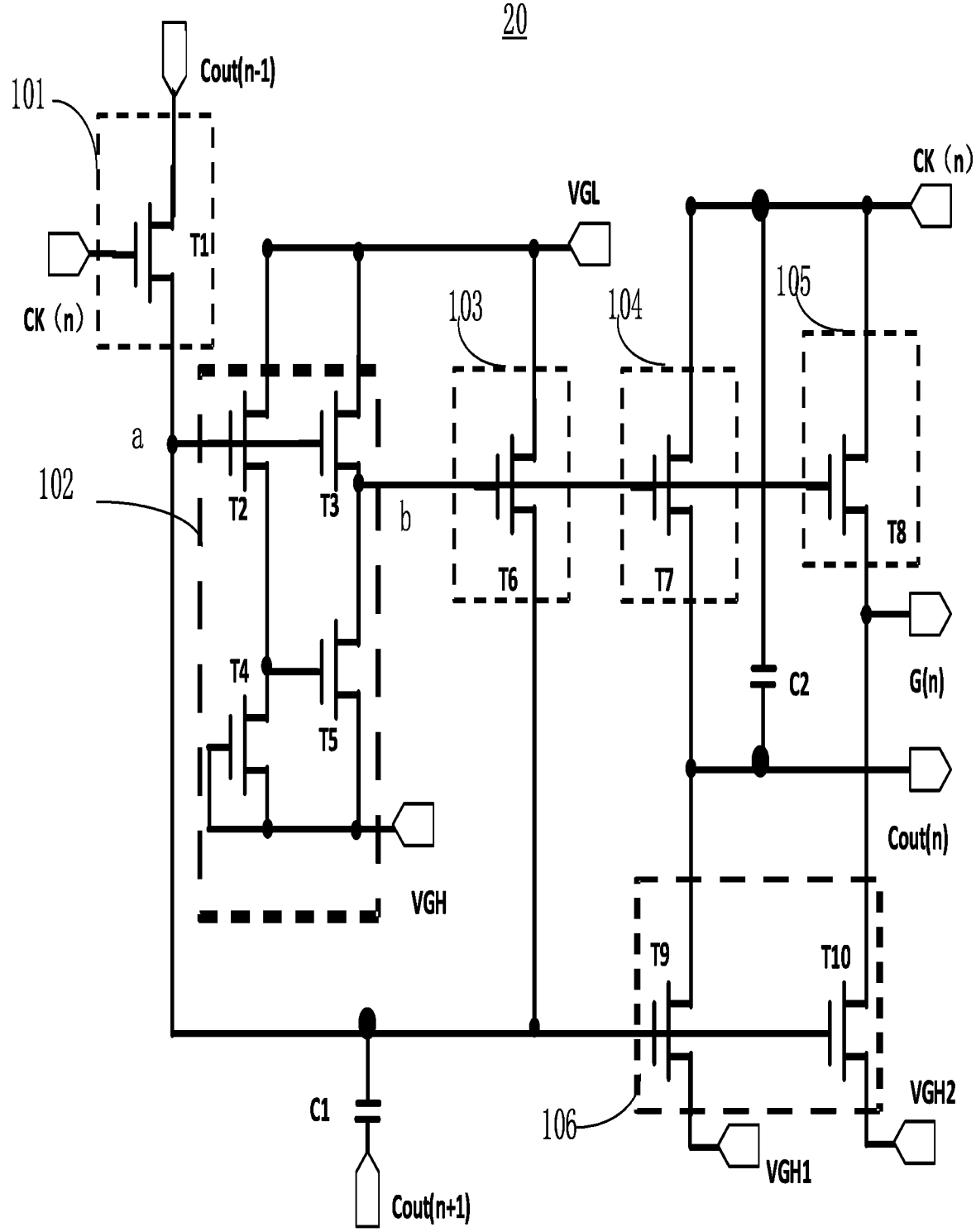
FIG. 5 is a schematic view showing a second circuit of a GOA unit in a GOA circuit of an embodiment of the invention.

Further, please refer to FIG. 5, where FIG. 5 is a schematic view showing a second circuit of a GOA unit in a GOA circuit of an embodiment of the invention. The difference between the circuit shown in FIG. 5 and the circuit shown in FIG. 2 is that: the GOA circuit shown in FIG. 5 further comprises a first capacitor C1 and a second capacitor C2. A first terminal of the first capacitor C1 is electrically connected to the first node a, and a second terminal of the first capacitor C1 is electrically connected to a next stage transmitted signal Cout(n+1). A first terminal of the second capacitor C2 is electrically connected to the current stage clock signal CK(n), and a second terminal of the second capacitor C2 is electrically connected to the current stage transmitted signal.

Figure 6:
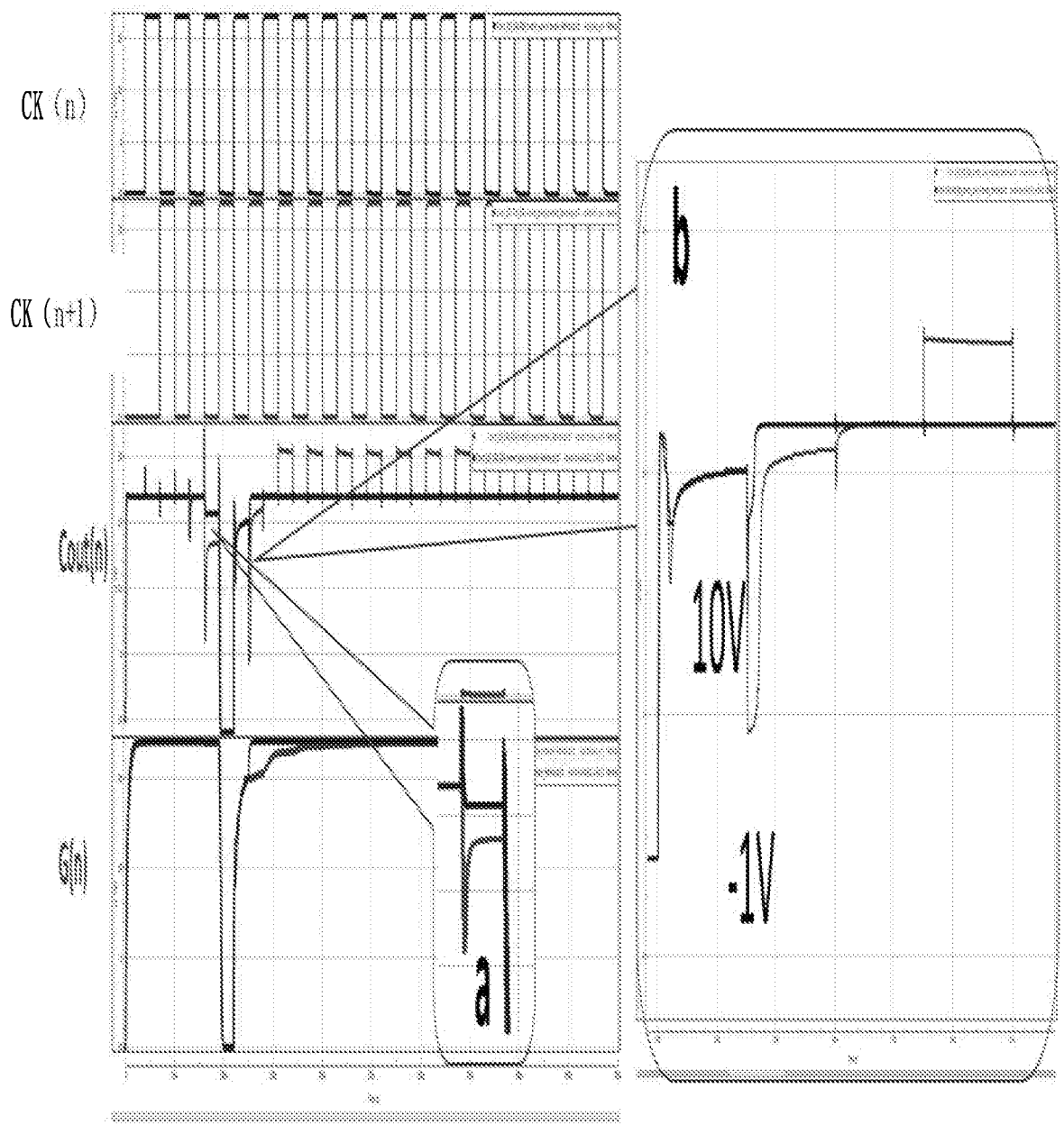
FIG. 6 is a signal timing sequence diagram showing principles for voltage stabilizing a GOA unit in a GOA circuit of an embodiment of the invention.

Specifically, please refer to FIG. 6, where FIG. 6 is a signal timing sequence diagram showing principles of voltage stabilizing a GOA unit in a GOA circuit of an embodiment of the invention. With reference to FIGS. 5 and 6, for portion (a), due to the coupling of the voltage drop of the first node a with the current stage transmitted signal Cout(n), in the embodiment of the application, a second capacitor C2 is added between the current stage clock signal CK(n) signal and the current stage transmitted signal Cout(n), the coupling of the voltage level of the first node a with the current stage transmitted signal Cout(n) is offset by rising of the current stage clock signal CK(n) to improve the amplitude of the signal at the point. For the dropping portion (b) due to charging of the first node a in the next Level GOA unit by the Cout(n) of the current stage transmitted signal, in the embodiment of this application, the first capacitance C1 is connected between the next level pass signal Cout (N+1) and the first node in a GOA unit of the current stage. The voltage level of the first node a is increased for a short period through coupling between the first node and a rising voltage level of the next stage transmitted signal Cout (n+1), thus improving turning ON operations and output capabilities of the ninth transistor T9 and the tenth transistor T10, to improve stability of the stage transmitted signals.

The first capacitor C1 and the second capacitor C2 are added to the GOA circuit in the embodiment of the application to improve stability of the stage transmitted signals, and a time period of the rising output signals is reduced from 30.68 us to 15.15 us, which is improved by about one fold.

Figure 7:
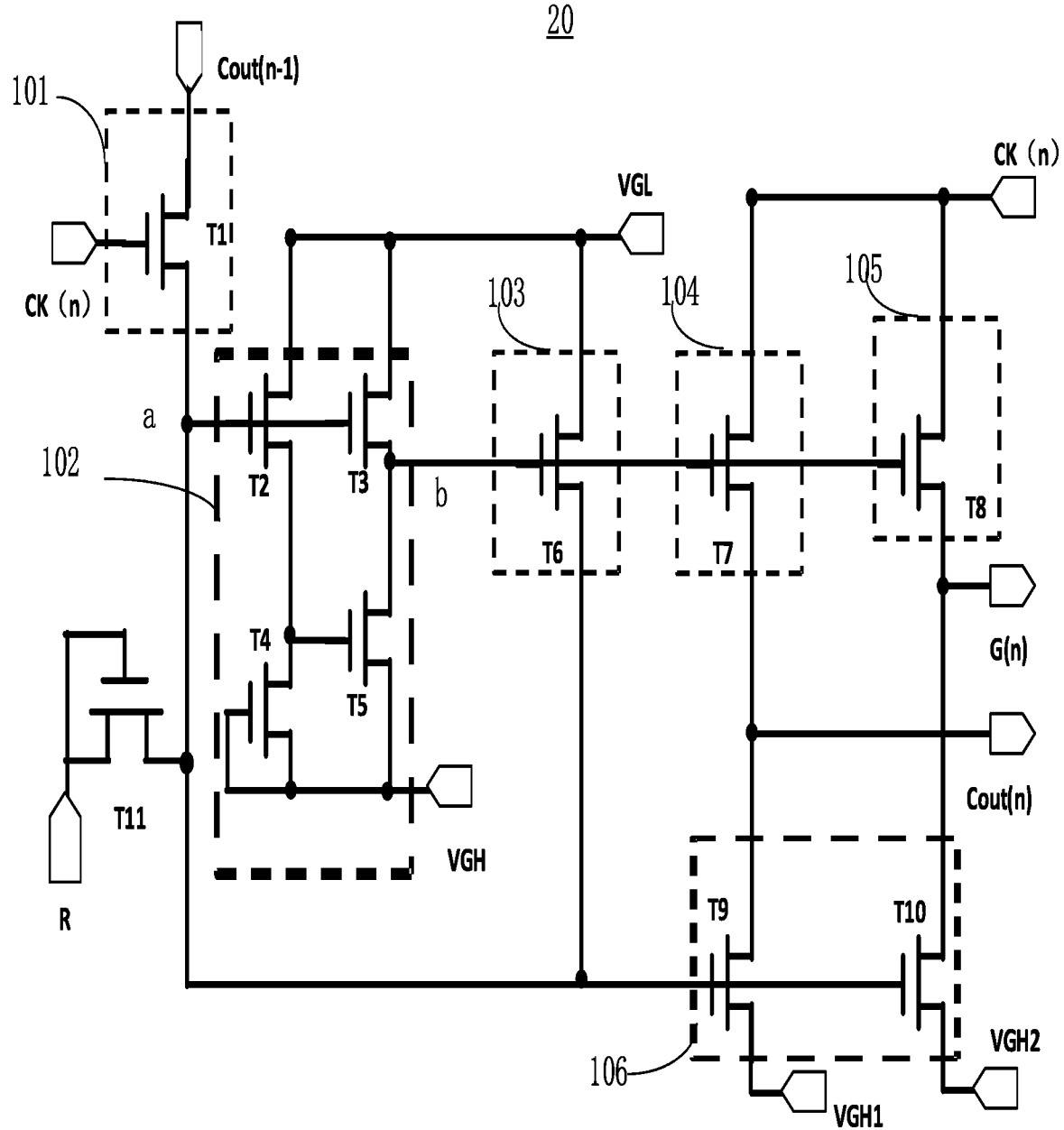
FIG. 7 is a schematic view showing a third circuit of a GOA unit in a GOA circuit of an embodiment of the invention.

Additionally, please refer to FIG. 7, where FIG. 7 is a schematic view showing a third circuit of a GOA unit in a GOA circuit of an embodiment of the invention. The difference between the circuit in FIG. 7 and the circuit in FIG. 2 is that: the GOA circuit in FIG. 7 further comprises an eleventh transistor T11. A gate terminal and a source terminal of the eleventh transistor T11 are connected to a reset signal R, and a drain terminal of the eleventh transistor T11 is connected to the first node a.

Specifically, as shown in FIG. 3 and FIG. 7, during bootstrapping of the GOA circuit of the embodiment of the application, the GOA unit in each stage is reset through the eleventh transistor T11 of the GOA unit in the same stage, thus improving stability of the GOA circuit. Specifically, in a reset phase t0, the voltage level of the reset signal R is high, and the eleventh transistor T11 is ON, thus making the voltage level of the first node a high. The voltage level of the first node a is high, so that the second transistor T2 and the third transistor T3 are ON, thus making the voltage level of the second node B low. Because the voltage level of the second node b is low, the sixth transistor T6, the seventh transistor T7, and the eighth transistor T8 are OFF. Because the voltage level of the first node a is high, the ninth transistor T9 and the tenth transistor T10 are ON, the voltage level of the current stage transmitted signal Cout(n) is high, and the voltage level of the current stage scanning signal G(n) is high.

Figure 8:
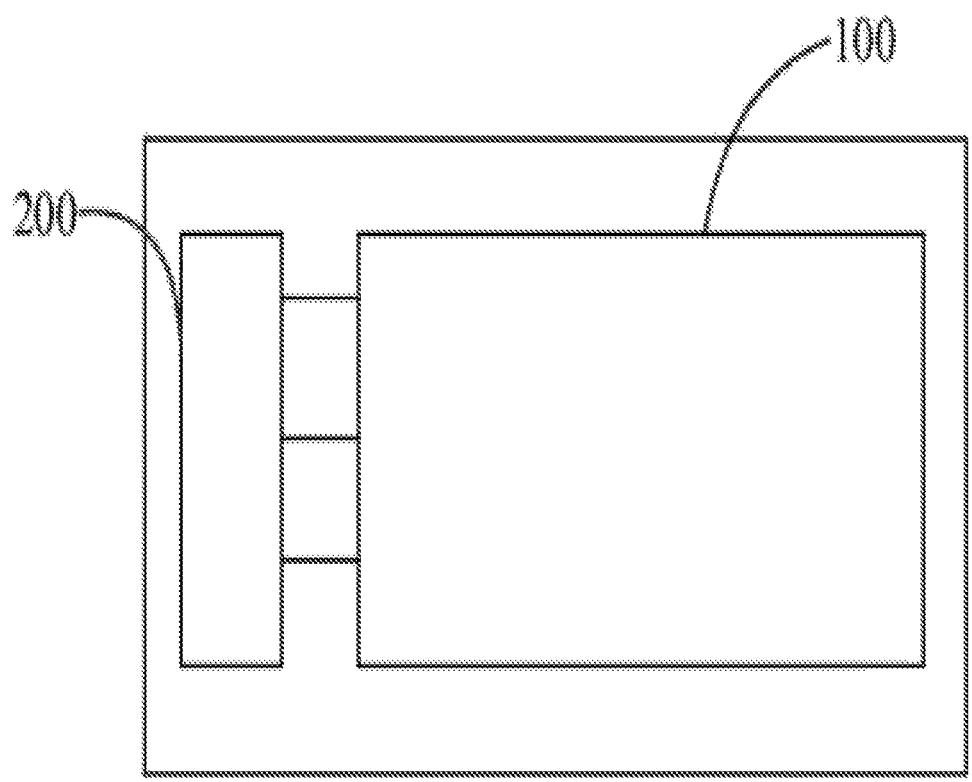
FIG. 8 is a schematic view showing a display apparatus of an embodiment of the invention.

Please refer to FIG. 8, where FIG. 8 is a schematic diagram of the display panel provided by the embodiment of this application. As shown in FIG. 8, the display panel includes the display area 100 and the GOA circuit 200 integrated by an edge of the display area 100, where the GOA circuit 200 is similar to the structure and principles of the GOA circuit described above and is not repeated here.

The above description is merely some embodiments of the present invention, which does not limit the scope of the invention. Any equivalent structure or process modification based on the specification and drawing of the invention, or any application of disclosure either directly or indirectly applied in other relevant technical fields, are included in the scope of claims of the invention.

What is claimed is:

1. A gate driver on array (GOA) circuit, comprising:
a multi-stage cascade of GOA units, each of which includes: an input module, an inversion module, a clamping module, a first output module, a second output module, and an output control module;
the input module is connected to a current stage clock signal and a prior stage transmitted signal, and electrically connected to a first node, and is configured to output the prior stage transmitted signal to the first node under control of the current stage clock signal;
the inversion module is electrically connected to a second node and the first node, and is configured to control a voltage level of the second node under control of a voltage level of the first node;
the clamping module is connected to a low level signal and electrically connected to the second node and the first node, and is configured to maintain the voltage level of the first node at a voltage level of the low level signal under control of the voltage level of the second node;
the first output module is connected to the current stage clock signal and electrically to the second node, and is configured to output a current stage transmitted signal under control of the voltage level of the second node;
the second output module is connected to the current stage clock signal and electrically connected to the second node, and is configured to output a current stage scanning signal under control of the voltage level of the second node;
the output control module is connected to a first high level signal and a second high level signal, and electrically to the first node, the current stage scanning signal, and the current stage transmitted signal, and is configured to pull the current stage transmitted signal up to a voltage level of the first high level signal, and the current stage scanning signal up to a voltage level of the second high level signal under control of the voltage level of the first node;
wherein the voltage level of the first high level signal is greater than the voltage level of the second high level signal, and a high voltage level of the current stage clock signal is equal to the voltage level of the first high level signal;
the GOA circuit further comprises an eleventh transistor, a gate terminal and a source terminal of the eleventh transistor are connected to a reset signal, and a drain terminal of the eleventh transistor is connected to the first node;
the GOA circuit further comprises a first capacitor and a second capacitor;
a first terminal of the first capacitor is electrically connected to the first node, and a second terminal of the first capacitor is electrically connected to a next stage transmitted signal;
a first terminal of the second capacitor is electrically connected to the current stage clock signal, and a second terminal of the second capacitor is electrically connected to the current stage transmitted signal.

2. The GOA circuit of claim 1, wherein the input module comprises a first transistor, a gate terminal of the first transistor is connected to the current stage clock signal, and a source terminal of the first transistor is connected to the prior stage transmitted signal, and a drain terminal of the first transistor is connected to the first node.

3. The GOA circuit of claim 2, wherein the inversion module comprises a second transistor, a third transistor, a fourth transistor, and a fifth transistor, a gate terminal of the second transistor and a gate terminal of the third transistor are electrically connected to the first node, and a source terminal of the second transistor and a source terminal of the third transistor are connected to the low level signal, a drain terminal of the second transistor, a drain terminal of the fourth transistor, and a gate terminal of the fifth transistor are electrically connected, a gate terminal of the fourth transistor, a source terminal of the fourth transistor and a source terminal of the fifth transistor are electrically connected with a high level signal, a drain terminal of the third transistor and a drain terminal of the fifth transistor are electrically connected with the second node.

4. The GOA circuit of claim 3, wherein the clamping module comprises a sixth transistor, a gate terminal of the sixth transistor is connected to the second node, and a source terminal of the sixth transistor is electrically connected to the low level signal, and a drain terminal of the sixth transistor is connected to the first node.

5. The GOA circuit of claim 4, wherein the first output module comprises a seventh transistor, a gate terminal of the seventh transistor is connected to the second node, and a source terminal of the seventh transistor is connected to the current stage clock signal, and a drain terminal of the seventh transistor is connected to the current stage transmitted signal.

6. The GOA circuit of claim 5, wherein the second output module comprises an eighth transistor, a gate terminal of the eighth transistor is connected to the second node, and a source terminal of the eighth transistor is connected to the current stage clock signal, and a drain terminal of the eighth transistor is connected to the current stage scanning signal.

7. The GOA circuit of claim 6, wherein the output control module comprises a ninth transistor and a tenth transistor, a gate terminal of the ninth transistor and a gate terminal of the tenth transistor are electrically connected to the first node, and a source terminal of the ninth transistor is connected to the first high level signal, and a source terminal of the tenth transistor is connected to the second high level signal, a drain terminal of the ninth transistor is connected to the current stage transmitted signal, and a drain terminal of the tenth transistor is connected to the current stage scanning signal.

8. A gate driver on array (GOA) circuit, comprising:
a multi-stage cascade of GOA units, each of which includes: an input module, an inversion module, a clamping module, a first output module, a second output module, and an output control module;

the input module is connected to a current stage clock signal and a prior stage transmitted signal, and electrically connected to a first node, and is configured to output the prior stage transmitted signal to the first node under control of the current stage clock signal;

the inversion module is electrically connected to a second node and the first node, and is configured to control a voltage level of the second node under control of a voltage level of the first node;

the clamping module is connected to a low level signal and electrically connected to the second node and the first node, and is configured to maintain the voltage level of the first node at a voltage level of the low level signal under control of the voltage level of the second node;

the first output module is connected to the current stage clock signal and electrically to the second node, and is configured to output a current stage transmitted signal under control of the voltage level of the second node;

the second output module is connected to the current stage clock signal and electrically connected to the second node, and is configured to output a current stage scanning signal under control of the voltage level of the second node;

the output control module is connected to a first high level signal and a second high level signal, and electrically to the first node, the current stage scanning signal, and the current stage transmitted signal, and is configured to pull the current stage transmitted signal up to a voltage level of the first high level signal, and the current stage scanning signal up to a voltage level of the second high level signal under control of the voltage level of the first node;

wherein the voltage level of the first high level signal is greater than the voltage level of the second high level signal, and a high voltage level of the current stage clock signal is equal to the voltage level of the first high level signal.

9. The GOA circuit of claim 8, wherein the GOA circuit further comprises an eleventh transistor, a gate terminal and a source terminal of the eleventh transistor are connected to a reset signal, and a drain terminal of the eleventh transistor is connected to the first node.

10. The GOA circuit of claim 8, wherein the GOA circuit further comprises a first capacitor and a second capacitor;

a first terminal of the first capacitor is electrically connected to the first node, and a second terminal of the first capacitor is electrically connected to a next stage transmitted signal;

a first terminal of the second capacitor is electrically connected to the current stage clock signal, and a second terminal of the second capacitor is electrically connected to the current stage transmitted signal.

11. The GOA circuit of claim 8, wherein the input module comprises a first transistor, a gate terminal of the first transistor is connected to the current stage clock signal, and a source terminal of the first transistor is connected to the prior stage transmitted signal, and a drain terminal of the first transistor is connected to the first node.

12. The GOA circuit of claim 11, wherein the inversion module comprises a second transistor, a third transistor, a fourth transistor, and a fifth transistor, a gate terminal of the second transistor and a gate terminal of the third transistor are electrically connected to the first node, and a source terminal of the second transistor and a source terminal of the third transistor are connected to the low level signal, a drain terminal of the second transistor, a drain terminal of the fourth transistor, and a gate terminal of the fifth transistor are electrically connected, a gate terminal of the fourth transistor, a source terminal of the fourth transistor and a source terminal of the fifth transistor are electrically connected with a high level signal, a drain terminal of the third transistor and a drain terminal of the fifth transistor are electrically connected with the second node.

13. The GOA circuit of claim 12, wherein the clamping module comprises a sixth transistor, a gate terminal of the sixth transistor is connected to the second node, and a source terminal of the sixth transistor is electrically connected to the low level signal, and a drain terminal of the sixth transistor is connected to the first node.

14. The GOA circuit of claim 13, wherein the first output module comprises a seventh transistor, a gate terminal of the seventh transistor is connected to the second node, and a source terminal of the seventh transistor is connected to the current stage clock signal, and a drain terminal of the seventh transistor is connected to the current stage transmitted signal.

15. The GOA circuit of claim 14, wherein the second output module comprises an eighth transistor, a gate terminal of the eighth transistor is connected to the second node, and a source terminal of the eighth transistor is connected to the current stage clock signal, and a drain terminal of the eighth transistor is connected to the current stage scanning signal.

16. The GOA circuit of claim 15, wherein the output control module comprises a ninth transistor and a tenth transistor, a gate terminal of the ninth transistor and a gate terminal of the tenth transistor are electrically connected to the first node, and a source terminal of the ninth transistor is connected to the first high level signal, and a source terminal of the tenth transistor is connected to the second high level signal, a drain terminal of the ninth transistor is connected to the current stage transmitted signal, and a drain terminal of the tenth transistor is connected to the current stage scanning signal.

17. A display apparatus, comprising:

a gate driver on array (GOA) circuit comprising a multi-stage cascade of GOA units, each of which includes: an input module, an inversion module, a clamping module, a first output module, a second output module, and an output control module;

the input module is connected to a current stage clock signal and a prior stage transmitted signal, and electrically connected to a first node, and is configured to output the prior stage transmitted signal to the first node under control of the current stage clock signal;

the inversion module is electrically connected to a second node and the first node, and is configured to control a voltage level of the second node under control of a voltage level of the first node;

the clamping module is connected to a low level signal and electrically connected to the second node and the first node, and is configured to maintain the voltage level of the first node at a voltage level of the low level signal under control of the voltage level of the second node;

the first output module is connected to the current stage clock signal and electrically to the second node, and is configured to output a current stage transmitted signal under control of the voltage level of the second node;

the second output module is connected to the current stage clock signal and electrically connected to the second node, and is configured to output a current stage scanning signal under control of the voltage level of the second node;

the output control module is connected to a first high level signal and a second high level signal, and electrically to the first node, the current stage scanning signal, and the current stage transmitted signal, and is configured to pull the current stage transmitted signal up to a voltage level of the first high level signal, and the current stage scanning signal up to a voltage level of the second high level signal under control of the voltage level of the first node;

wherein the voltage level of the first high level signal is greater than the voltage level of the second high level signal, and a high voltage level of the current stage clock signal is equal to the voltage level of the first high level signal.

18. The display apparatus of claim 17, wherein the input module comprises a first transistor, a gate terminal of the first transistor is connected to the current stage clock signal, and a source terminal of the first transistor is connected to the prior stage transmitted signal, and a drain terminal of the first transistor is connected to the first node.

19. The display apparatus of claim 18, wherein the inversion module comprises a second transistor, a third transistor, a fourth transistor, and a fifth transistor, a gate terminal of the second transistor and a gate terminal of the third transistor are electrically connected to the first node, and a source terminal of the second transistor and a source terminal of the third transistor are connected to the low level signal, a drain terminal of the second transistor, a drain terminal of the fourth transistor, and a gate terminal of the fifth transistor are electrically connected, a gate terminal of the fourth transistor, a source terminal of the fourth transistor and a source terminal of the fifth transistor are electrically connected with a high level signal, a drain terminal of the third transistor and a drain terminal of the fifth transistor are electrically connected with the second node.

20. The display apparatus of claim 19, wherein the clamping module comprises a sixth transistor, a gate terminal of the sixth transistor is connected to the second node, and a source terminal of the sixth transistor is electrically connected to the low level signal, and a drain terminal of the sixth transistor is connected to the first node.

* * * * *